(12) United States Patent
Cho et al.

(10) Patent No.: US 6,503,768 B2
(45) Date of Patent: Jan. 7, 2003

(54) METHOD FOR MONOLITHIC INTEGRATION OF MULTIPLE DEVICES ON AN OPTOELECTRONIC SUBSTRATE

(75) Inventors: Si Hyung Cho, Macungie, PA (US); Ronald E. Leibenguth, Palmerton, PA (US); Abdallah Ougazzaden, Emmaus, PA (US); Claude L. Reynolds, Sinking Springs, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/821,212

(22) Filed: Mar. 29, 2001

(65) Prior Publication Data

US 2002/0173063 A1 Nov. 21, 2002

(51) Int. Cl.⁷ ............................. H01L 21/00; G02B 6/12
(52) U.S. Cl. ..................... 438/21; 438/27; 438/28; 385/14
(58) Field of Search ............... 438/27, 28, 31, 438/32, 35; 385/14

(56) References Cited

U.S. PATENT DOCUMENTS

| | | | | | |
|---|---|---|---|---|---|
| 5,689,600 | A | * | 11/1997 | Griffin | 385/88 |
| 5,795,798 | A | * | 8/1998 | Mishra et al. | 438/35 |
| 5,920,766 | A | * | 7/1999 | Floyd | 438/35 |
| 6,001,664 | A | * | 12/1999 | Swirhun et al. | 438/31 |
| 6,282,220 | B1 | * | 8/2001 | Floyd | 372/50 |
| 6,174,749 | B1 | * | 1/2002 | Yuen et al. | 438/35 |

* cited by examiner

*Primary Examiner*—John F. Niebling
*Assistant Examiner*—Viktor Simkovic (57) ABSTRACT

The present invention provides a method for monolithic integration of multiple devices on an optoelectronic substrate. The method, in a preferred embodiment, includes forming an active layer having a given wavelength over a substrate. The method further includes forming an N-type doped layer over a portion of the active layer to form first and second active regions within the active layer, the first active region having the given wavelength and the second active region having an altered wavelength different from the given wavelength. In one exemplary embodiment, the conditions used to form the N-type doped layer, for example, dopant concentration, growth rate and temperature, cause the difference in wavelength between the given wavelength and the altered wavelength.

20 Claims, 10 Drawing Sheets

METHOD FOR MONOLITHIC INTEGRATION OF MULTIPLE DEVICES ON AN OPTOELECTRONIC SUBSTRATE

TECHNICAL FIELD OF THE INVENTION

The present invention is directed, in general, to telecommunication systems and, more specifically, to a method for monolithic integration of multiple devices on an optoelectronic substrate, and a method of manufacturing an optical fiber communications system associated therewith.

BACKGROUND OF THE INVENTION

Optical fibers are key components in modern telecommunications and have gained wide acceptance. As is well known, telecommunication optical fibers are thin strands of glass capable of transmitting an optical signal containing a large amount of information over long distances with very low loss. Single fibers can carry multiple packets of data that are multiplexed on the fiber either by time division, where different slots of time are allocated to different packets, or by wave division multiplexing, where different wavelengths are allocated for different data. Optoelectronic devices, such as modulators and switches, perform the important function of adding information content to optical signals in optical communications systems. Such devices may include epitaxially grown multi quantum well type structures of an indium phosphide or indium gallium arsenide phosphide (InGaAsP) base. The quantum well type structures may be undoped, or may be doped with various n-type and p-type dopants.

Traditionally, the optoelectronic industry focused on hybrid integration of optoelectronic devices, wherein many optoelectronic devices are manufactured on individual optoelectronic substrates, all of which are subsequently connected by optical fibers. Hybrid integration was sufficient for traditional telecommunication devices, however, with the current increased demand for reliably carrying increased amounts of data, hybrid integration is problematic. Specifically, hybrid integration may experience poor optical coupling between the optical devices and the optical fiber, poor mechanical stability of the circuit, high cost, and low performance. Thus, in an attempt to circumvent some of the problems associated with hybrid integration, the current trend in the optoelectronic industry is to manufacture multiple optical devices on a single optical substrate. Manufacturing multiple optical devices on a single optical substrate, or so-called monolithic integration, is the ultimate solution to the problems discussed above, however, current manufacturing techniques each have problems associated therewith.

One manufacturing technique currently used to monolithically integrate multiple devices on a single optical substrate is called the "butt joint" technique. The "butt joint" technique typically consists of growing a first device structure, for example a laser, on the whole wafer, followed by selective etching and regrowth of an area not protected by a mask layer, and representing a second device. The "butt joint" technique currently allows for independent design of different devices and is used by many manufacturers, however, it commonly experiences certain problems at the junction between the first device and the second device. For example, the "butt joint" technique may experience edge effect issues at the junction, material quality issues at the junction, and dislocations at the junction that may produce optical losses by absorption.

Another technique commonly used to monolithically integrate multiple devices on a single optical substrate is a selective epitaxy technique (selective area growth). The selective epitaxy technique is based on variations in the band gap of multi quantum well materials in the same plane with a single growth step over a masked substrate. Grown material, which does not nucleate on the dielectric masked area is deposited nearby, inducing a local increase in growth rate. Epitaxial layer bandgap energy shifts may then be controlled by the geometry of the dielectric pattern. The selective epitaxy technique has certain benefits, however, it may only be used when two devices require the same number and composition of quantum wells. Moreover, without encountering problems with the material composition, the change in wavelength attainable by the selective epitaxy technique only ranges from about 50 nm to about 100 nm. Furthermore, the selective epitaxy technique may only be conducted with a metalorganic chemical vapor deposition (MOCVD) device, which may not be used in a majority of manufacturing plants, and is extremely expensive.

Another technique currently used to monolithically integrate multiple devices on a single optical substrate is a quantum well intermixing technique. Quantum well intermixing generally requires deposition of a selective mask over areas where the second device is desired, followed by a high temperature anneal in the presence of phosphorous or arsenic. The high temperature anneal causes a selective interdiffusion between the quantum wells and barriers below the selective mask, causing a shift in wavelength in the areas where the selective mask is located. The problem with the quantum well intermixing technique is that the high temperature anneal occurs at a temperature above the quantum well temperature growth rate, thus leading to degradation of the material quality. Moreover, the quantum well intermixing technique is limited to no more than two devices.

Accordingly, what is needed in the art is a method to monolithically integrate multiple optical devices on a single optical substrate, and a method of manufacturing a telecommunication system, which does not experience the difficulties and problems associated with the prior art methods.

SUMMARY OF THE INVENTION

To address the above-discussed deficiencies of the prior art, the present invention provides a method for monolithic integration of multiple devices on an optoelectronic substrate. The method, in a preferred embodiment, includes forming an active layer having a given wavelength over a substrate. The method further includes forming an N-type doped layer over a portion of the active layer to form first and second active regions within the active layer, the first active region having the given wavelength and the second active region having an altered wavelength different from the given wavelength. In one exemplary embodiment, the conditions used to form the N-type doped layer, for example, dopant concentration, growth rate and temperature, may vary the amount of difference in wavelength between the given wavelength and the altered wavelength. Because the N-type doped layer may be formed at temperatures at or below the temperature required to form the active region, degradation of the active region and diffusion of dopants therein are substantially eliminated.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The invention is best understood from the following detailed description when read with the accompanying FIGURES. It is emphasized that in accordance with the standard practice in the optoelectronic industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
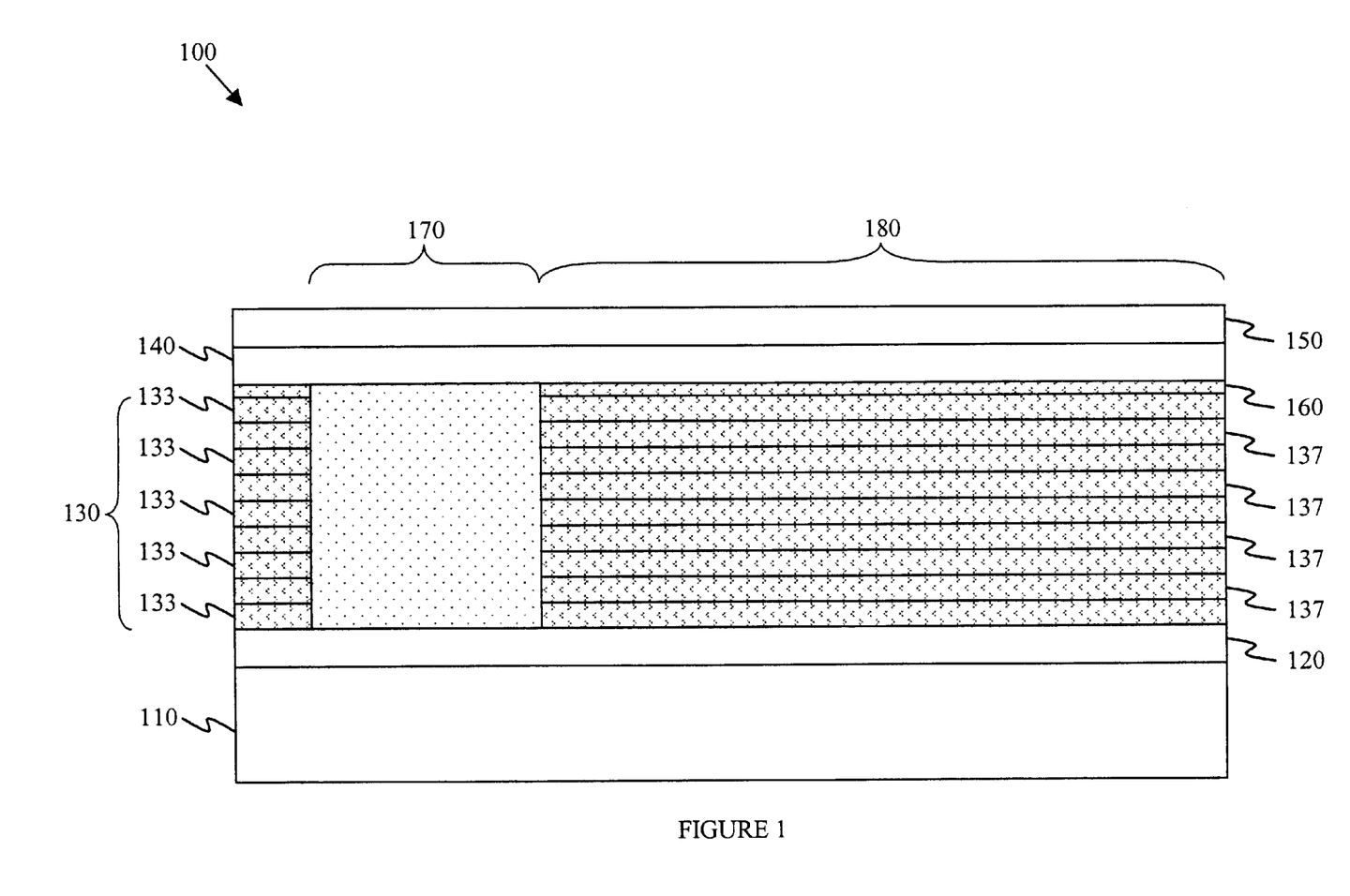
FIG. 1 illustrates a cross-sectional view of a completed optoelectronic device, which may be manufactured according to the inventive method disclosed herein.

Referring initially to FIG. 1, illustrated is a cross-sectional view of a completed optoelectronic device 100, which may be manufactured according to the inventive method disclosed herein. The present inventive method is broadly directed to an optoelectronic device made of any material or compound that may have uses in such devices. In the illustrative embodiment shown herein, the optoelectronic device 100 is specifically discussed as a group III through group V based device, for example an indium phosphide/indium gallium arsenide phosphide based device, a gallium arsenide based device, an aluminum gallium arsenide based device, or another group III through group V based device. However, even though the present invention is discussed in the context of a group III through group V based device, it should be understood that the present invention is not limited to group III through group V compounds and that other compounds located outside these groups may be used.

In the embodiment shown in FIG. 1, the optoelectronic device 100 includes a substrate 110, a lower buffer layer 120 and a conventional active region 130. The active region 130 may, as illustrated, comprise a multi quantum well structure, including separate confining layers, for example barrier layers 133 and quantum wells 137. In the illustrative embodiment shown in FIG. 1, the active region 130 comprises five barrier layers 133 and four quantum wells 137. It should be noted, however, that the active region 130 could comprise more or less barrier layers 133 and quantum wells 137 than illustrated in FIG. 1, depending on the design. An upper buffer layer 140 and a capping layer 150 may be located over active region 130. In a preferred embodiment of the invention, the optoelectronic device 100, further includes a separate confinement layer 160 located between the active region 130 and the upper buffer layer 140. The optoelectronic device 100 also includes a first active region 170 and a second active region 180. The first and second action regions 170, 180 are configured to have or produce different wavelengths of light generated from an electrical pulse. The wavelength of a material may be defined as the lowest wavelength (or effective bandgap) of light that may be passed through that material to cause absorption of the light. For example, the first active region 170 may be a laser and the second active region 180 may be a modulator. However, one skilled in the art understands that the first and second active regions 170, 180, could comprise other devices, such as optical amplifiers, optical waveguides or other similar devices.

Figure 2:
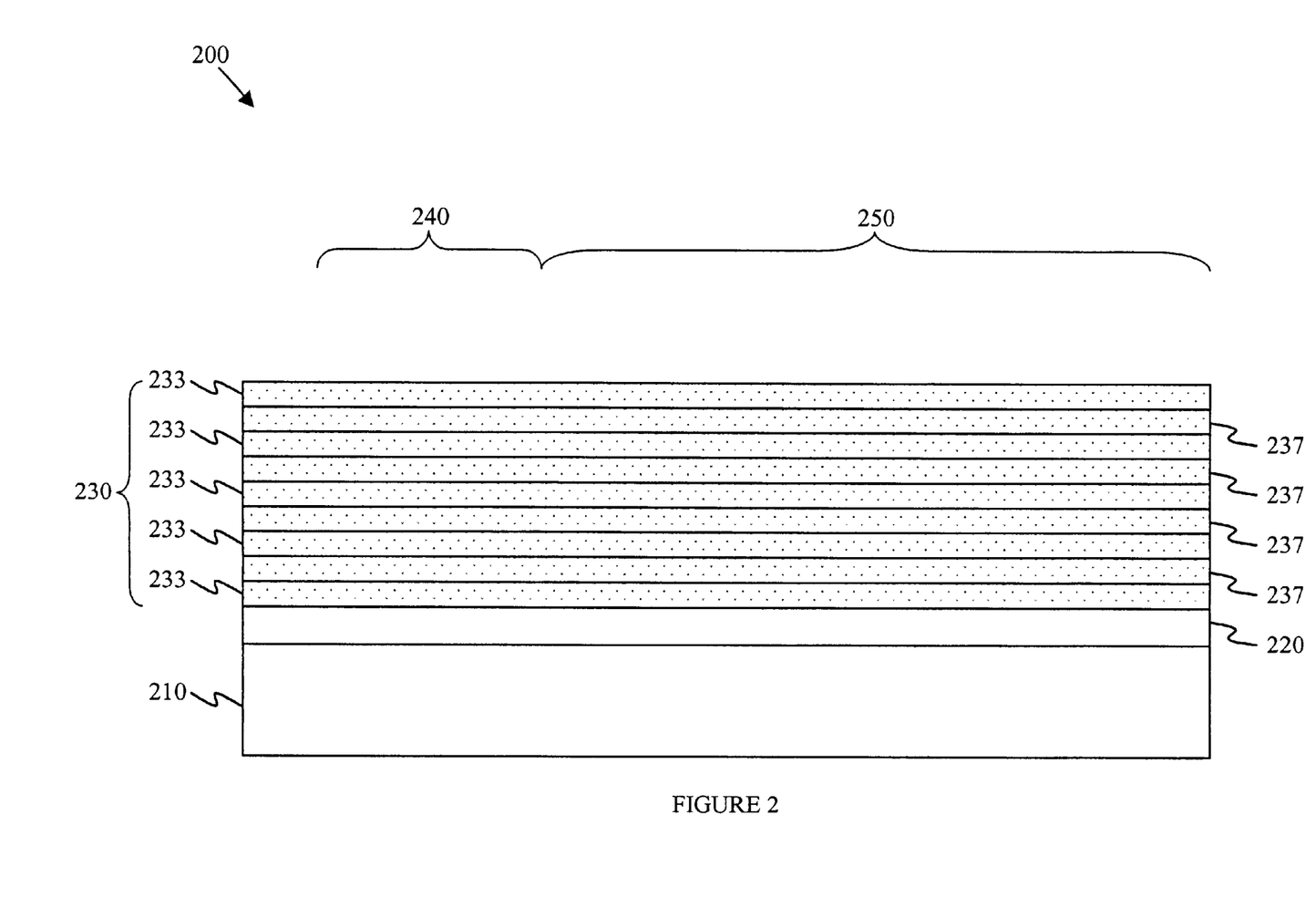
FIG. 2 illustrates a cross-sectional view of a partially completed optoelectronic device.

Turning to FIGS. 2–7, with continued reference to FIG. 1, illustrated is one embodiment produced by a method of manufacturing the optoelectronic device 100, including a method of monolithic integration of multiple active regions on an optoelectronic substrate. FIG. 2 illustrates a cross-sectional view of a partially completed optoelectronic device 200. The partially completed optoelectronic device illustrated in FIG. 2, includes a lower buffer layer 220, which in a previous step (not shown) was formed over an optoelectronic substrate 210, which may be any layer located in an optoelectronic device. The optoelectronic substrate 210, in the exemplary embodiment shown in FIGS. 2–7, is a highly n-doped indium phosphide (InP) optoelectronic substrate.

As previously mentioned, located over the optoelectronic substrate 210 may be the lower buffer layer 220. The lower buffer layer 220, in the illustrative embodiment, is an n-doped InP buffer layer having a thickness of about 500 nm. It should be noted, however, that the lower buffer layer 220 is not limited to an n-doped InP layer, and that other materials, doped or undoped, may be used. Formed over the lower buffer layer 220 is an active region 230. The active region 230, as previously mentioned during the discussion of FIG. 1, may be a conventional multi quantum well structure, including barrier layers 233 and quantum wells 237. In an exemplary embodiment of the invention, the active region 230 includes materials chosen from group III through group V compounds. The active region 230 is typically intentionally not doped, however, in an alternative embodiment it may be doped as long as the p-n junction placement is taken into consideration. In the exemplary embodiment shown in FIG. 1, the barrier layers 233 have a thickness ranging from about 6 nm to about 8 nm and a given wavelength of about 1.24 $\mu$m, and the quantum wells 237 have a thickness ranging from about 6 nm to about 8 nm and a given wavelength of about 1.55 $\mu$m. The optoelectronic substrate 210, lower buffer layer 220 and active region 230 may typically be formed using conventional processes, including but not limited to metalorganic vapor-phase epitaxy (MOVPE), epitaxial processes, or other similar processes. Also illustrated in FIG. 2, are proposed first and second active device regions 240, 250, respectively.

Figure 3:
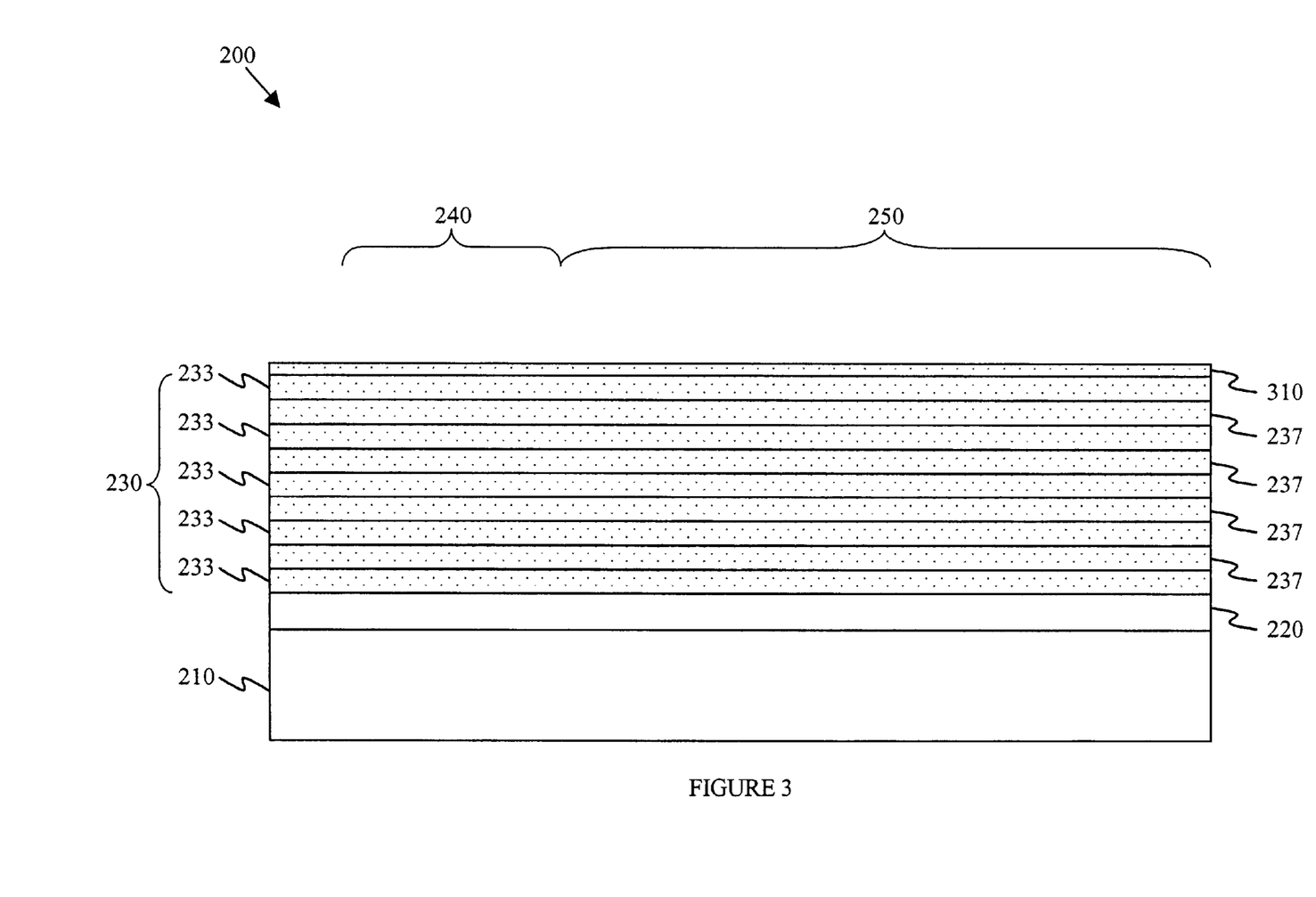
FIG. 3 illustrates the partially completed optoelectronic device illustrated in FIG. 2, after formation of an optional barrier layer.

Turning to FIG. 3, illustrated is the partially completed optoelectronic device 200 illustrated in FIG. 2, after formation of an optional cladding layer 310. In the illustrative embodiment shown in FIG. 3, the cladding layer 310 is formed on the active region 230. In an exemplary embodiment, the cladding layer 310 is an undoped InP cladding layer. The cladding layer 310 may be doped, and more specifically, doped with a p-type dopant, such as zinc, which may diffuse very easily in subsequent processing steps. The cladding layer 310 may, in an exemplary embodiment, have a thickness ranging from about 0.1 nm to about 0.2 nm and may be formed using any conventional process.

Figure 4A:
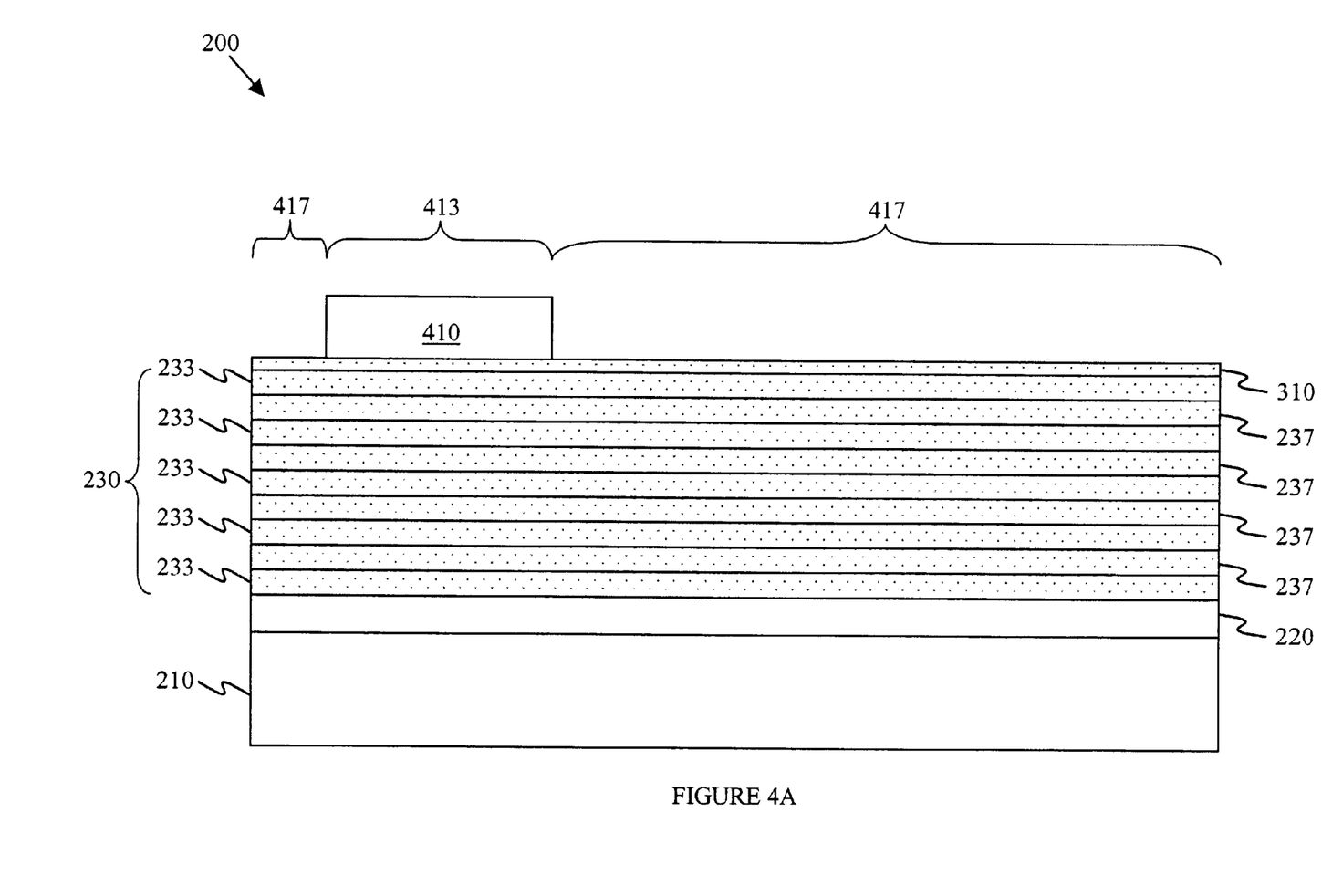
FIGS. 4A and 4B illustrate a cross-sectional view and a top view of the partially completed optoelectronic device illustrated in FIG. 3, after formation of a mask portion.
Figure 4B:
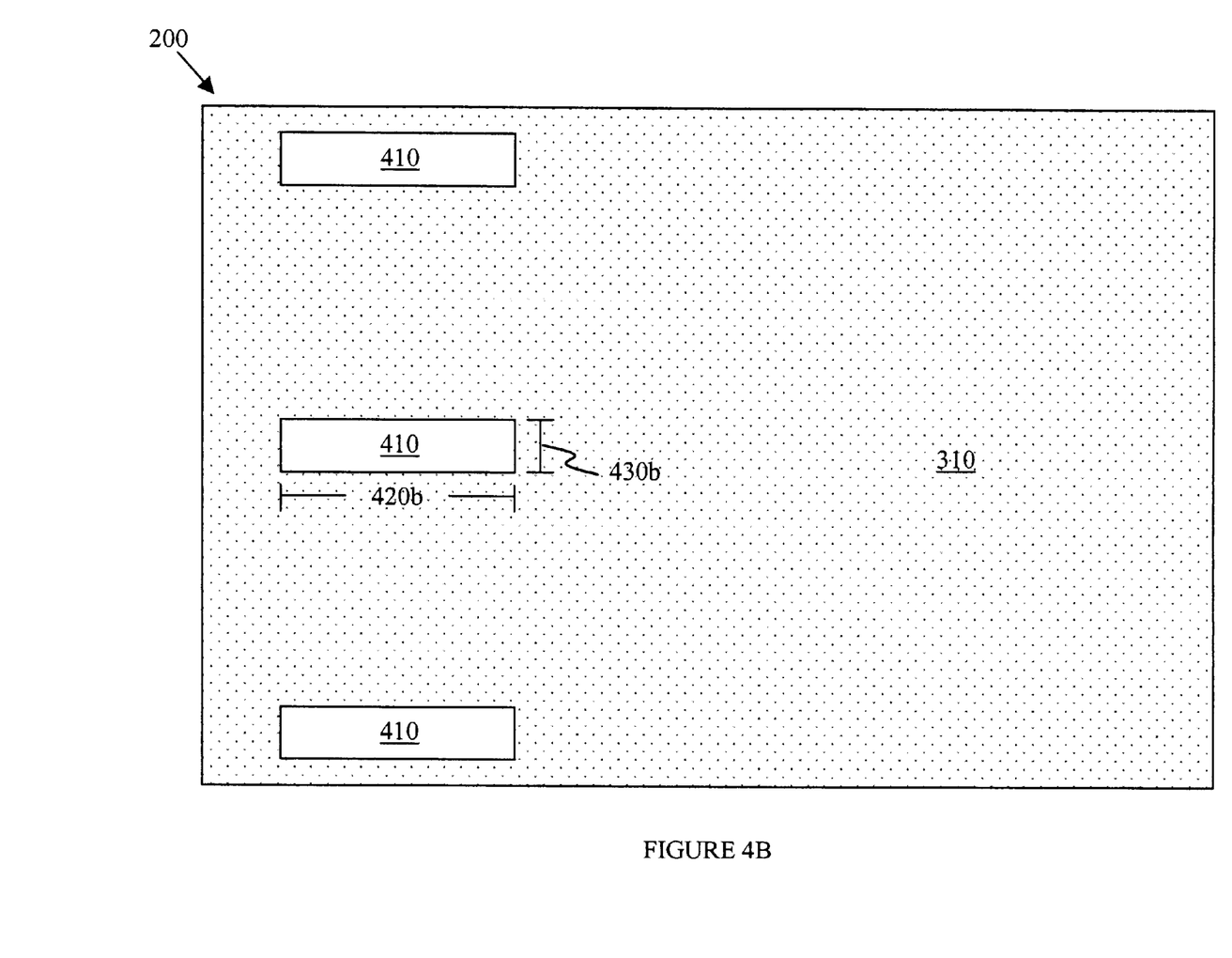

Turning to FIGS. 4A and 4B, illustrated is a cross-sectional view and a top view, respectively, of the partially completed optoelectronic device 200 illustrated in FIG. 3, after formation of a mask portion 410. As illustrated, the mask portion 410 may be formed over an area of the active region 230 where the proposed first active device region 240 is. The presence of the mask portion 410 forms a masked active region 413 and an unmasked active region 417. The mask portion 410 substantially inhibits a shift in effective wavelength of the active region 230 located thereunder, during a subsequent processing step. One having skill in the art generally understands how to form the mask portion 410. Referring specifically to FIG. 4B, in a preferred embodiment of the invention, the mask portion has a length 420b substantially equal to a length of the desired first active region 170 (FIG. 1). Likewise, the mask portion 410 may have a width 430b substantially equal to a width of the desired first active region 170. For example, if the first active region 170 is a laser, the length of the mask portion 410 might range from about 300 μm to about 400 μm and the width might be about 6 μm.

Figure 5:
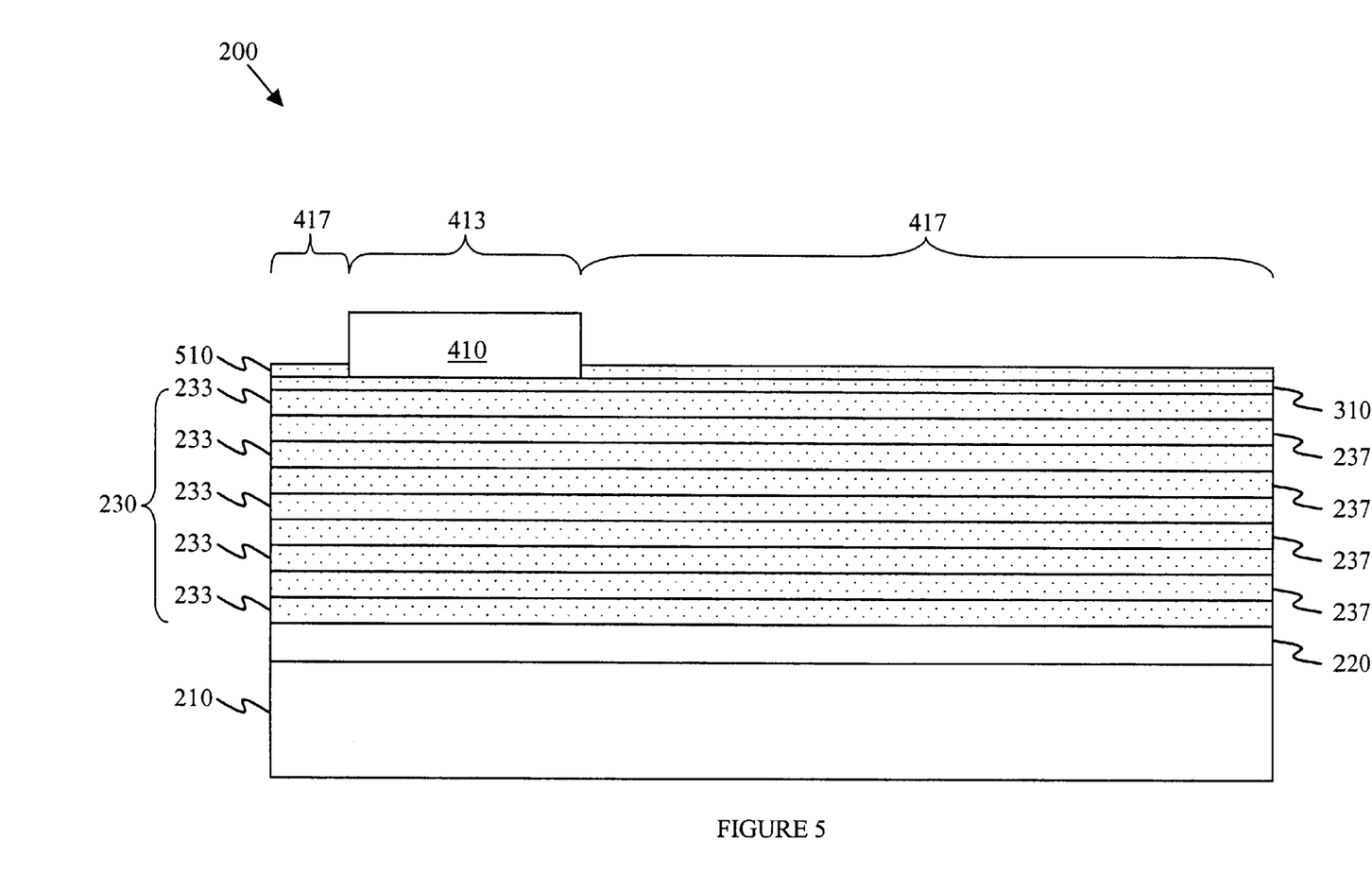
FIG. 5 illustrates the formation of an etch stop layer over the surface of the active region except where the masked active region is located.

FIG. 5 illustrates the formation of an optional etch stop layer 510 over the surface of the active region 230 except where the masked active region 413 is located. The etch stop layer 510, which may be an indium gallium arsenide phosphide or other similar layer, provides a barrier between the indium phosphide layer 310 and an N-Type doped layer, which is formed in a subsequent step. It should be noted that the etch stop layer 510 may be formed using a known process that is consistent with the present invention, including metalorganic vapor phase epitaxy (MOVPE).

Figure 6:
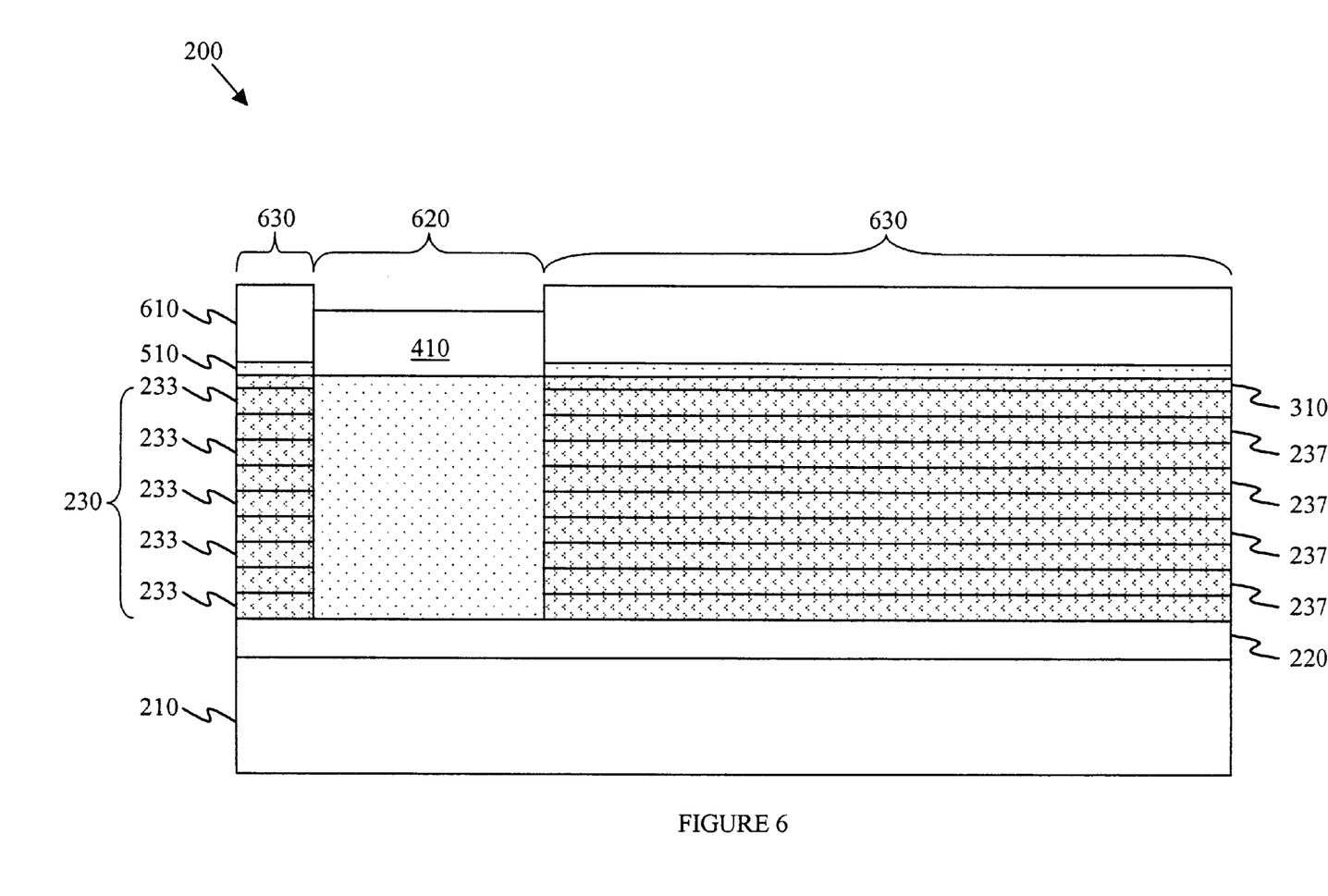
FIG. 6 illustrates the partially completed optoelectronic device illustrated in FIG. 5, after formation of an N-type doped layer over an unmasked active region.

Turning to FIG. 6, illustrated is the partially completed optoelectronic device 200 illustrated in FIG. 5, after formation of an N-type doped layer 610, which in one embodiment may be doped with silicon, over the unmasked active region 417. The N-type doped layer 610, which in the illustrative embodiment is an N-type indium phosphide layer, substantially alters the effective wavelength of the active region 230 located thereunder and forms a first active region 620 having the given wavelength and a second active region 630 having an altered wavelength different from the given wavelength. In a preferred embodiment of the invention, variations in a growth rate, a dopant concentration, a deposition temperature or mask geometry may affect how much the N-type doped layer 610 alters the wavelength of the second active region 630. In a preferred embodiment, the growth rate may range from about 0.5 μm/hour to about 3.5 μm/hour, the dopant concentration may range from about $1E18/cm^3$ to about $4E18/cm^3$, and the formation temperature may range from about 600° C. to about 680° C. In an alternative embodiment, the N-type doped layer 610 may be formed at a pressure of 1 atmosphere or less, and to a thickness ranging from about 1 μm to about 2 μm. The N-type doped layer 610 may be formed using many processes including metalorganic vapor deposition (MOCVD), chemical beam epitaxy (CBE), hydride vapor phase epitaxy (HVPE), liquid phase epitaxy (LPE), or another similar process.

The N-type doped layer 610 that is formed over the active region 230 may be used to form a first active region 620 comprising a laser and a second active region 630 comprising a modulator. For example, when the first active region 620 is a laser and has a given wavelength of about 1.55 μm, the second active region 630 could be a modulator that has an altered wavelength of about 1.45 μm. It should be noted, however, that other devices comprising the first and second active regions 620, 630, could be used, and that the altered wavelength in the second active region 630 may vary from the given wavelength in the first active region 620 by up to about 0.2 μm.

Figure 7:
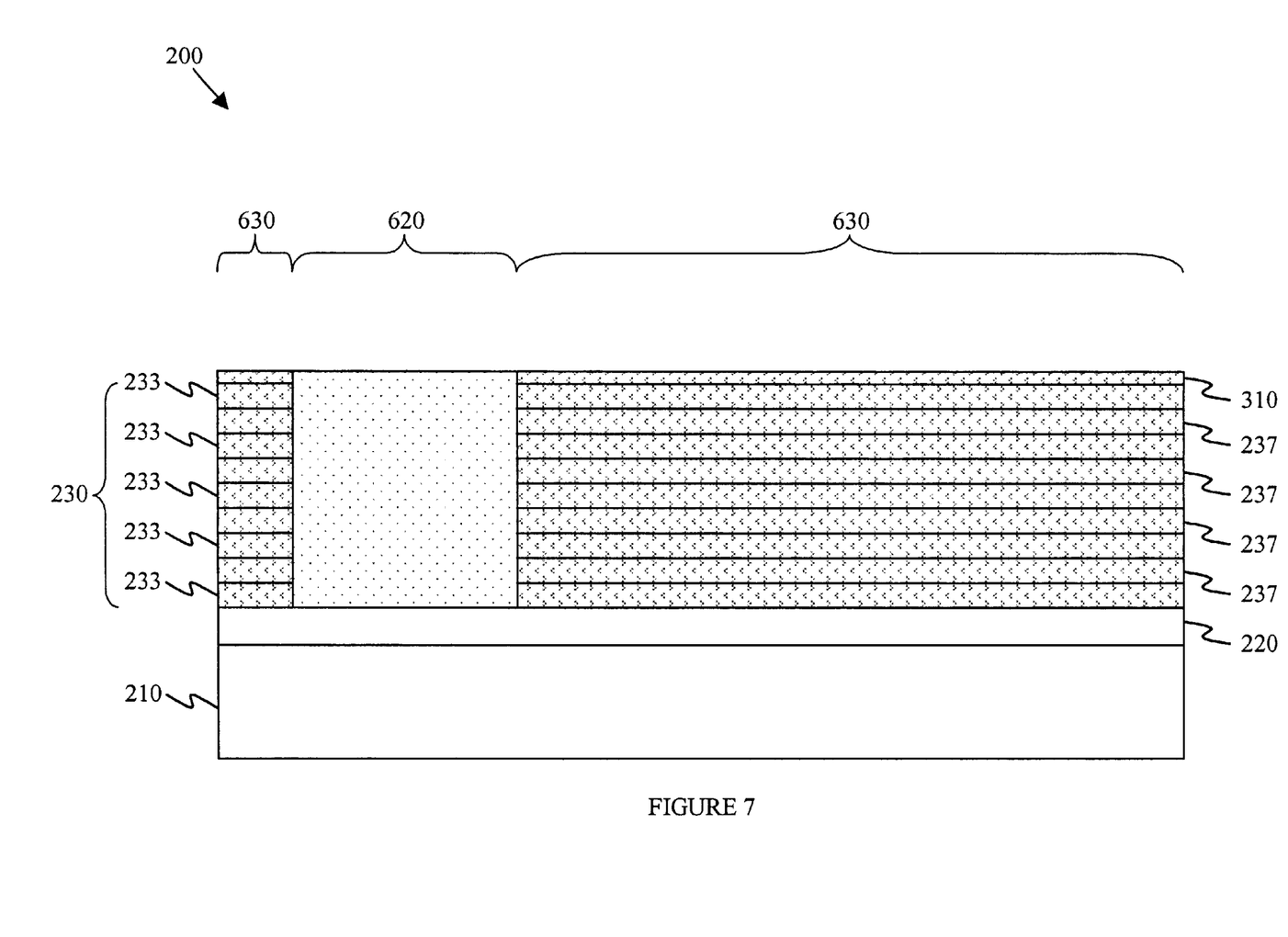
FIG. 7 illustrates the partially completed optoelectronic device illustrated in FIG. 6, including a first active region and a second active region, after removal of the N-type doped layer, etch stop layer and mask portion.

Turning to FIG. 7, illustrated is the partially completed optoelectronic device 200 illustrated in FIG. 6, including the first active region 620 and second active region 630, after removal of the N-type doped layer 610, etch stop layer 510 and mask portion 410. In a typical situation the N-type doped layer 610 and etch stop layer 510 may be removed prior to removing the mask portion 410. Many techniques may be used to remove the N-type doped layer 610. For example, in one particularly advantageous embodiment, a selective etch or other similar technique may be used to remove the N-type doped layer 610, stopping on the etch stop layer 510. Subsequent to removing the N-type doped layer 610, a selective etch capable of removing the etch stop layer 510 may be conducted to remove the etch stop layer 510. After removing the N-type doped layer 610 and etch stop layer 510, the mask portion 410 may be removed using a conventional removal process.

Figure 8:
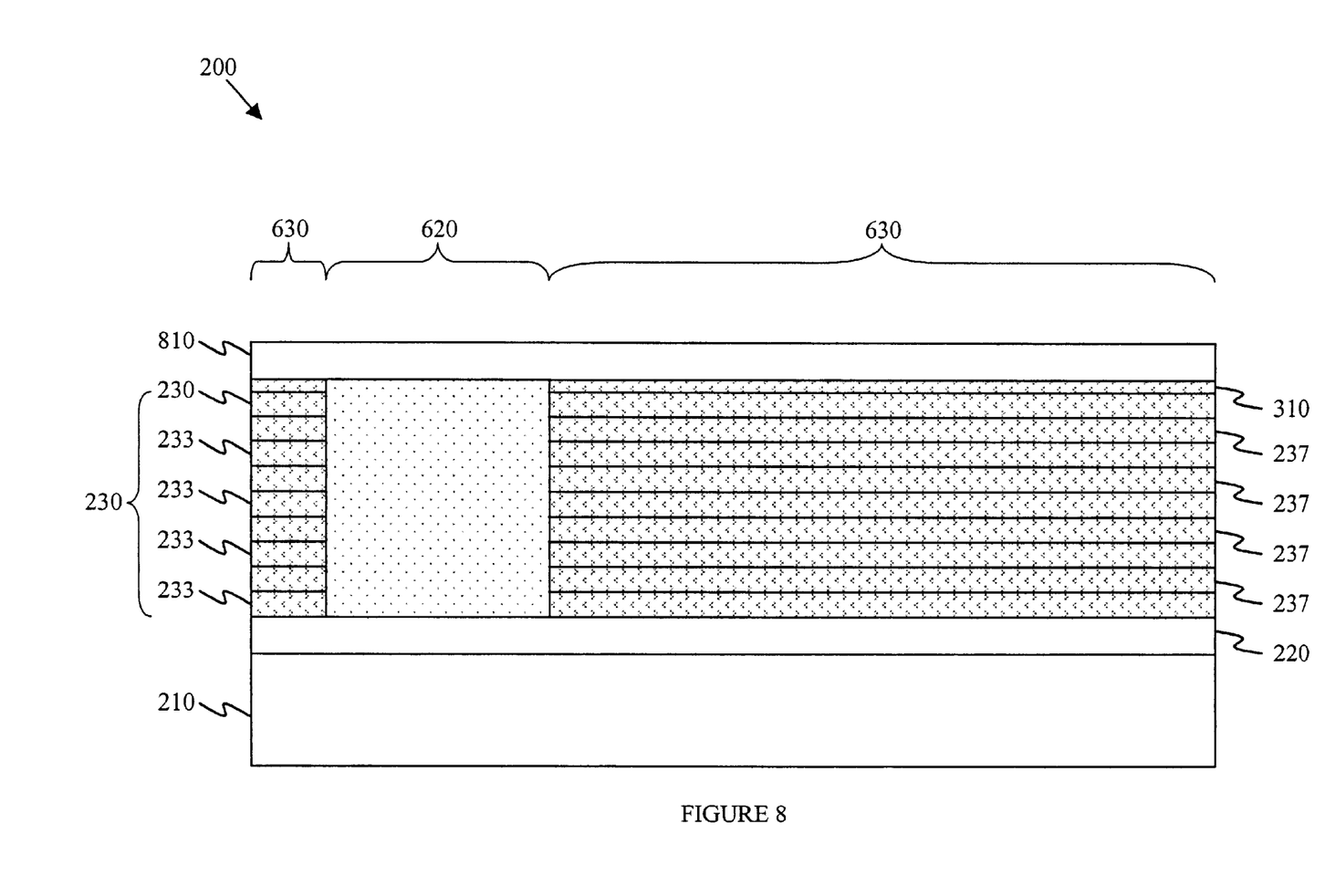
FIG. 8 illustrates the partially completed optoelectronic device illustrated in FIG. 7, after formation of an upper buffer layer.

Turning to FIG. 8, illustrated is the partially completed optoelectronic device 200 illustrated in FIG. 7, after formation of an optional upper buffer layer 810. The upper buffer layer 810, in an advantageous embodiment, is a P-type indium phosphide upper buffer layer. Since the P-type dopant may be introduced into the partially completed optoelectronic device 200 at such a late processing step, the amount of zinc diffusion therein and amount of damage caused therefrom is substantially minimized. After completion of the upper buffer layer 810, the capping layer 150 may be formed, resulting in the completed optoelectronic device 100 illustrated in FIG. 1. In a preferred embodiment, the capping layer 150 may comprise a P-type indium gallium arsenide layer. However, it may generally be understood that other materials, and various and conventional processing techniques, may be used to form the capping layer 150.

The currently discussed method for monolithic integration of multiple devices on an optoelectronic substrate, allows easy and accurate formation of multiple devices having varying effective wavelengths on the optoelectronic substrate. Furthermore, the present method allows for an accurate and selective shift in effective wavelength depending on the growth rate of the N-type doped layer 610 and concentration of dopants within such a layer 610. Likewise, the present method also allows for an accurate shift of effective wavelength up to about 0.2 μm, which is currently not available in the prior art methods. It should also be mentioned that the present inventive method may be combined with other applications, including but not limited to selective area growth.

Figure 9:
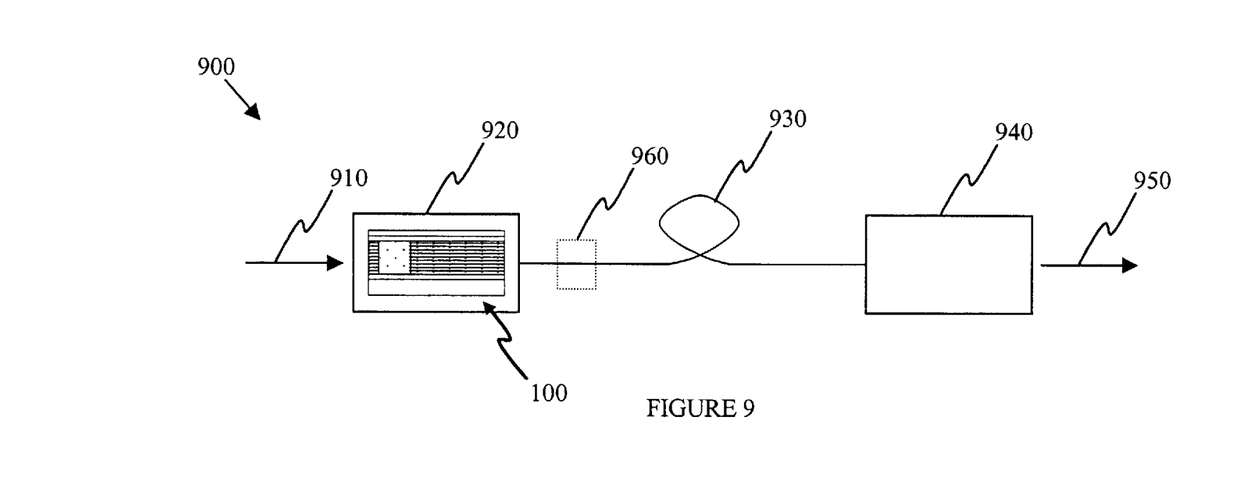
FIG. 9 illustrates an optical fiber communication systems, which may form one environment where the completed optoelectronic device may be included.

Turning briefly to FIG. 9, illustrated is an optical fiber communication systems 900, which may form one environment in which the completed optoelectronic device 100 may be used. The optical fiber communication system 900, in the illustrative embodiment, includes an initial signal 910 entering a receiver 920. The receiver 920, receives the initial signal 910, addresses the signal 910 and sends the resulting information across an optical fiber 930 to a transmitter 940. The transmitter 940 receives the information from the optical fiber 930, addresses the information and sends an ultimate signal 950. As illustrated in FIG. 9, the completed optoelectronic device 100 may be included within the receiver 920. However, the completed optoelectronic device 100 may also be included anywhere in the optical fiber communication system 900, including the transmitter 940. The optical fiber communication system 900 is not limited to the devices previously mentioned. For example, the optical fiber communication system 900 may include a source 960, such as a laser or a diode.

Figure 10:
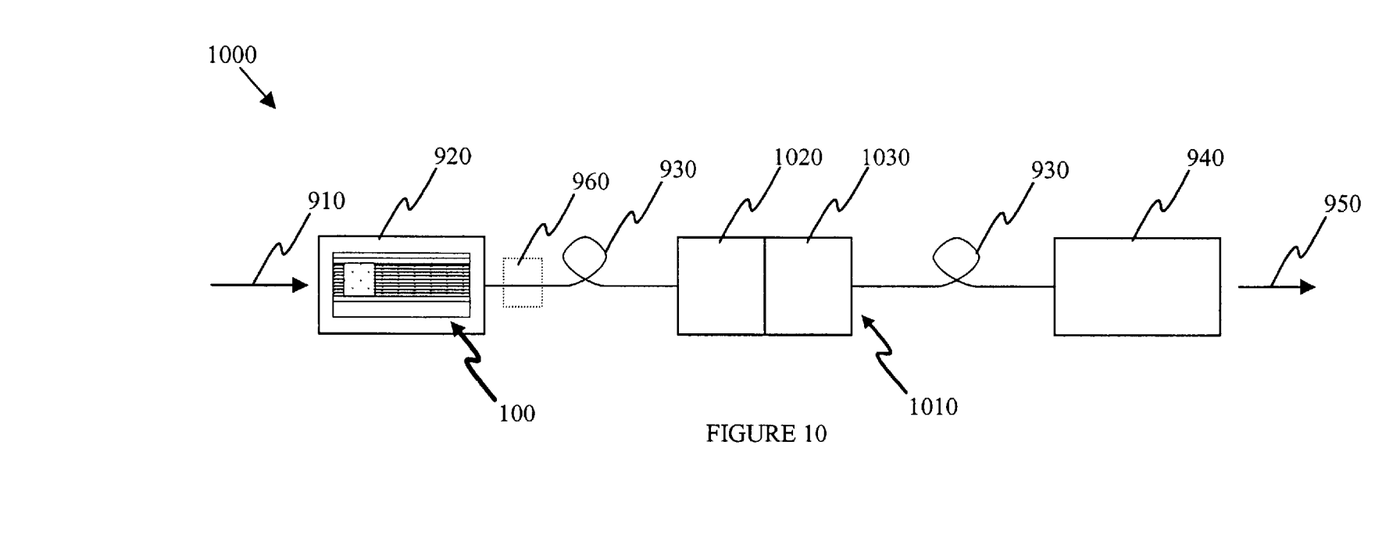
FIG. 10 illustrates an alternative optical fiber communication system.

Turning briefly to FIG. 10, illustrated is an alternative optical fiber communication system 1000, having a repeater 1010, including a second receiver 1020 and a second transmitter 1030, located between the receiver 1020 and the transmitter 1040.

Although the present invention has been described in detail, those skilled in the art should understand that they can make various changes, substitutions and alterations herein without departing from the spirit and scope of the invention in its broadest form.

What is claimed is:

1. A method for monolithic integration of multiple devices on an optoelectronic substrate, comprising:
    forming an active layer having a given wavelength over a substrate; and
    forming an N-type doped layer over a portion of the active layer to form first and second active regions within the active layer, the first active region having the given wavelength and the second active region having an altered wavelength different from the given wavelength.

2. The method as recited in claim 1 further including forming a indium phosphide layer between the active region and the N-type doped layer.

3. The method as recited in claim 1 further including forming an etch stop layer over an unmasked active region prior to allowing the N-type doped layer to form over the unmasked active region.

4. The method as recited in claim 3 wherein a masked active region and the unmasked active region have the given wavelength and the method further includes altering the given wavelength of the unmasked active region by the formation of the N-type doped layer to obtain the altered wavelength.

5. The method as recited in claim 4 wherein altering the given wavelength by the formation of the N-type doped layer includes altering the given wavelength as a function of a growth rate, dopant concentration, temperature or mask geometry used to form the N-type doped layer.

6. The method as recited in claim 5 wherein altering the given wavelength as a function of a dopant concentration includes altering the given wavelength as a function of a dopant concentration ranging from about $1E18/cm^3$ to about $4E18/cm^3$.

7. The method as recited in claim 4 wherein altering the given wavelength as a function of a temperature includes altering the given wavelength as a function of a temperature ranging from about 600° C. to about 680° C.

8. The method as recited in claim 4 wherein altering the given wavelength includes altering the given wavelength up to about 0.2 $\mu$m.

9. A method of manufacturing an optical fiber communication system, comprising:
    forming an optical fiber;
    forming a transmitter and a receiver connected by the optical fiber; and
    forming multiple devices on an optoelectronic substrate, including:
        forming an active layer having a given wavelength over a substrate; and
        forming an N-type doped layer over a portion of the active layer to form first and second active regions within the active layer, the first active region having the given wavelength and the second active region having an altered wavelength different from the given wavelength.

10. The method as recited in claim 9 further including forming a indium phosphide layer between the active region and the N-type doped layer.

11. The method as recited in claim 9 further including forming an etch stop layer over an unmasked active region prior to allowing the N-type doped layer to form over the unmasked active region.

12. The method as recited in claim 11 wherein a masked active region and the unmasked active region have the given wavelength and the method further includes altering the given wavelength of the unmasked active region by the formation of the N-type doped layer to obtain the altered wavelength.

13. The method as recited in claim 12 wherein altering the given wavelength by the formation of the N-type doped layer includes altering the given wavelength as a function of a growth rate, dopant concentration, temperature or mask geometry used to form the N-type doped layer.

14. The method as recited in claim 13 wherein altering the given wavelength as a function of a dopant concentration includes altering the given wavelength as a function of a dopant concentration ranging from about $1E18/cm^3$ to about $4E18/cm^3$.

15. The method as recited in claim 13 wherein altering the given wavelength as a function of a temperature includes altering the given wavelength as a function of a temperature ranging from about 600° C. to about 680° C.

16. The method as recited in claim 13 wherein altering the given wavelength includes altering the given wavelength up to about 0.2 $\mu$m.

17. The method recited in claim 9 wherein the transmitter includes the optoelectronic device.

18. The method recited in claim 9 wherein the receiver includes the optoelectronic device.

19. The method recited in claim 9 further including forming a repeater.

20. The method recited in claim 9 wherein forming multiple devices on an optoelectronic substrate includes forming devices selected from the group consisting of:
    lasers,
    modulators;
    optical amplifiers; and
    optical waveguides.

* * * * *